United States Patent
Copel et al.

[19]

[11] Patent Number: 5,997,638
[45] Date of Patent: Dec. 7, 1999

[54] LOCALIZED LATTICE-MISMATCH-ACCOMODATION DISLOCATION NETWORK EPITAXY

[75] Inventors: Matthew Warren Copel, Katonah, N.Y.; Michael Horn von Hoegen, Hannover, Germany; Francoise Isabelle Kolmer Le Goues, Peekskill; Rudolf Maria Tromp, Mount Kisco, both of N.Y.

[73] Assignee: International Business Machines Corporation, Armonk, N.Y.

[21] Appl. No.: 08/438,217

[22] Filed: May 9, 1995

Related U.S. Application Data

[63] Continuation of application No. 08/156,657, Nov. 22, 1993, abandoned, which is a continuation of application No. 07/626,082, Dec. 11, 1990, abandoned, which is a continuation-in-part of application No. 07/498,236, Mar. 23, 1990, abandoned.

[51] Int. Cl.⁶ .................................................... C30B 25/18
[52] U.S. Cl. .............................. 117/89; 117/91; 438/266; 438/271; 438/286; 438/291; 148/DIG. 59
[58] Field of Search .............. 117/89, 91; 148/DIG. 59; 438/291, 286, 271, 266

[56] References Cited

U.S. PATENT DOCUMENTS

| | | | |
|---|---|---|---|
| 3,394,289 | 7/1968 | Lindmayer | 437/111 |
| 4,255,208 | 3/1981 | Deutscher et al. | 437/131 |
| 4,769,341 | 9/1988 | Lurgz | 437/126 |
| 4,843,028 | 6/1989 | Herzog et al. | 437/126 |
| 4,891,329 | 1/1990 | Reisman et al. | 437/131 |
| 4,907,974 | 3/1990 | Gotoh | 437/126 |

FOREIGN PATENT DOCUMENTS

| | | | |
|---|---|---|---|
| 62-98614 | 5/1987 | Japan | 437/131 |
| 6428817 | 1/1989 | Japan | 437/131 |

OTHER PUBLICATIONS

B.-Y. Tsaur et al. *Applied Physics Letters,* vol. 38 pp. 779–781 (May 15, 1981).
T. Narusawa and W.M. Gibson *Physical Review Letters,* vol. 47, pp. 1459–1462 (Nov. 16, 1981).
R.M. Tromp et al. *Nuclear Instruments and Methods in Physics Research,* vol. B4, pp. 155–166 (1984).
M. Asai et al. *Journal of Applied Physics,* vol. 58, pp. 2577–2583 (Oct. 1, 1985).
J.F. van den Veen, *Surface Science Reports,* vol. 5, pp. 199–288, (1985).
R.I.G. Uhrberg et al. *Physical Review Letters,* vol. 56, pp. 520–523 (Feb. 3, 1986).
J. Bevk et al. *Applied Physics Letters,* vol. 49, pp. 286–288 (Aug. 4, 1986).
K. Sakamoto et al. *Japanese Journal of Applied Physics,* vol. 26, pp. 666–670 (May 1987).
M. Zinke–Allmang et al. *Journal of Vacuum Science and Technology,* vol. A5, pp. 2030–2031 (Jul./Aug. 1987).
R.D. Bringans et al. *Physica Scripta,* vol. T17, pp. 7–12, (1987).
M. Zinke–Allmang et al. *Materials Research Society Symposium Proceedings,* vol. 77, pp. 703–708 (1987).
P.M.J. Maree et al. *Surface Science,* vol. 191, pp. 305–328 (1987).

(List continued on next page.)

*Primary Examiner*—Robert Kunemund
*Attorney, Agent, or Firm*—Daniel P. Morris

[57] ABSTRACT

The present invention is a layered structures of substantially-crystalline semiconductor materials and processes for making such structures. More particularly, the invention epitaxial grows a substantially-crystalline layer of a second elemental semiconductor material on a substantially-crystalline first semiconductor material different from the second material in which there is a significant mismatch in at least one dimension between the crystal-lattice structures of the two materials.

12 Claims, 5 Drawing Sheets

OTHER PUBLICATIONS

M. Copel and R.M. Tromp *Physical Review B,* vol. 37, pp. 2766–2769 (Feb. 15, 1988).

M. Copel et al. *Physical Review B,* vol. 37 pp. 10756–10763 (Jun. 15, 1988).

F.J. Himpsel et al. *Physical Review B,* vol. 38 pp. 6084–6096 (Sep. 15, 1988).

G.J. Fisanick et al. *Materials Research Society Symposium Proceedings,* vol. 102, pp. 25–30 (1988).

H. Jorke *Surface Science,* vol. 193, pp. 569–578 (1988).

D.A. Steigerwald et al. *Surface Science,* vol. 202, pp. 472–492 (1988).

E. Kasper and H. Jorke *Chemistry and Physics of Solid Surfaces,* vol. 7, pp. 557–581 (1988).

C.-Y. Park et al. *Japanese Journal of Applied Physics,* vol. 27, pp. 147–148 (1988).

S.S. Iyer et al. *Applied Physics Letters,* vol. 54, pp. 219–221 (Jan. 16, 1989).

M. Copel et al. *Physical Review Letters,* vol. 63, pp. 632–635 (Aug. 7, 1989).

F.K. Le Goues et al. *Physical Review Letters,* vol. 63, pp. 1826–1829 (Oct. 23, 1989).

B.S. Meyerson et al. *Applied Physics Letters,* vol. 53, pp. 2555–2557 (Dec. 19, 1988).

J.C. Tsang et al. *Applied Physics Letters,* vol. 51, pp. 1732–1734 (Nov. 23, 1987).

M. A. Olmstead et al. *Physical Review B,* vol. 34, pp. 6041–6044 (Oct. 15, 1986).

LOCALIZED LATTICE-MISMATCH-ACCOMODATION DISLOCATION NETWORK EPITAXY

RELATED CASE

This application is a continuation of application Ser. No. 08/156,657 filed Nov. 22, 1993, abandoned, which is a continuation of Ser. No. 07/626,082 filed Dec. 11, 1990, abandoned, which is a continuation-in-part of application Ser. No. 07/498,236 filed Mar. 23, 1990, abandoned. Ser. No. 08/028,644 filed on Mar. 9, 1993 issued into U.S. Pat. No. 5,316,615 on May 31, 1994. Ser. No. 08/438,004 issued into U.S. Pat. No. 5,628,843 on May 13, 1997.

FIELD OF THE INVENTION

The present invention broadly concerns layered structures of substantially-crystalline semiconductor materials and processes for making such structures. More particularly, the invention concerns epitaxial growth of a substantially-crystalline layer of a second elemental semiconductor material on a substantially-crystalline first semiconductor material different from the second material in which there is a significant mismatch in at least one dimension between the crystal-lattice structures of the two materials,

BACKGROUND ART

A primary concern in obtaining crystalline film growth by molecular-beam epitaxy (MBE) or other vapor-phase technique is the mode of growth of the film. Three principal modes of such film growth are (1) layer-by-layer growth, referred to as a "Frank-Van der Merwe" growth mode; (2) "islanding," referred to as a "Volmer-Weber" growth mode; and (3) layer-by-layer growth to a threshold thickness, followed by islanding, referred to as a "Stranski-Krastanov" growth mode. In either growth mode which entails "islanding," the film ultimately becomes divided into domains or "islands" of crystallinity. Such a division of a film into islands of crystallinity constitutes a disruption of the long-range crystal structure desired for many applications—particularity for many applications in the field of solid-state electronics.

Surface free energies and lattice-strain energies are significant factors in determining which growth mode will be dominant when a crystallizable material is deposited on a surface of a substrate to form a film. Putting aside the matter of the lattice strain energy of the film, theoretical models of epitaxial growth suggest that the growth mode is largely determined by the surface free energy of the substrate surface ($\sigma_s$), the surface free energy of the deposited layer ($\sigma_f$), and an interface free energy ($\sigma_i$). An inequality expression involving these free energies $\sigma_s > \sigma_f + \sigma_i$ specifies a condition under which a deposited film effectively wets a substrate. When a crystallizable material deposited on a substrate wets the substrate, Frank-Van der Merwe layer-by-layer epitaxial growth may occur. If the inequality has the opposite direction, there is usually no wetting of the substrate when the crystallizable material is deposited on the substrate and Volmer-Weber immediate islanding growth tends to occur. The Stranski-Krastanov thickness-threshold islanding growth generally tends to occur when the deposited material wets the substrate, but the lattice strain energy of the resulting deposited layer is unfavorable, or when there is an added complication such as interface mixing or surface reconstruction.

It would often be desirable to fabricate a thick, structurally relaxed, substantially defect-free epitaxial layer of one element embedded in a crystalline matrix of another element. In other words, it would often be desirable to fabricate layered structures with a crystalline substrate of a first element, an embedded epitaxial layer of a second element, and a capping epitaxial layer of the first element of the substrate in which each of layers is structurally relaxed to a bulk crystalline structure and is substantially defect free.

In general, for two elements A and B, one of the elements has a lower surface free energy than the other. Consequently, if element A can be grown on element B in either a Frank-Van der Merwe layer-by-layer growth mode or a Stranski-Krastanov thickness-threshold islanding growth mode, then element B will grow on element A in a Volmer-Weber immediate islanding mode. Consequently, there is a significant barrier to the growth of an epitaxial layer of one element embedded in a crystalline matrix of the other element; that is, to the growth of layered structures of the elements in the order A/B/A or B/A/B. If the film to be embedded grows well on the substrate, then the capping layer ordinarily does not grow well on the film to be embedded. Conversely, if the capping layer were to grow well on the film to be embedded, then the film to be embedded would tend not to grow well on the substrate in the first instance.

Germanium has a lower surface free energy than that of silicon and the interface free energy $\sigma_i$ may generally be considered insignificant. Germanium growth on silicon above about 400° C. follows a Stranski-Krastanov thickness-threshold islanding growth mode: at coverages below about three monolayers, layer-by-layer epitaxial growth is usually observed. At coverages corresponding to more than about three monolayers of germanium, islanding of the germanium generally occurs.

Attempts have been made to avoid such islanding by inhibiting the mobility of the germanium layer by lowering the growth temperature. However, it is generally found that films grown by low temperature processes tend to suffer from poor crystal quality and frequently from inferior electrical properties as well. Other attempts to avoid islanding of germanium on silicon have involved increasing the rate of deposition of germanium. If the germanium deposition growth rate is sufficiently high, it is possible to grow germanium layers with thicknesses which exceed the thickness normally associated with islanding. However, even using such a high-growth rate technique, it has been found that germanium films can be made only about six monolayers thick before a deterioration of the film properties is observed.

The tendency of germanium films to island after the first few monolayers can be observed experimentally using Rutherford ion backscattering analysis. In FIG. 1, 100 keV He$^+$ Rutherford ion backscattering spectra of germanium deposited on a substrate of silicon (001) by a conventional molecular-beam-epitaxy process are plotted for the initial stages of germanium film growth at about 500° C. After approximately the first three monolayers, the intensity of the leading germanium peak saturates. With further increases in coverage by germanium, the background behind the germanium peak increases, indicating that growth is restricted to islands of $\geq 50$ Å thickness. The tendency of germanium to cluster on silicon has hindered previous attempts to grow thick, substantially defect-free epitaxial films of germanium on silicon. Thick, structurally relaxed films of germanium on silicon may be grown with conventional techniques after the germanium islands have coalesced. However, such germanium films generally contain high densities of crystal defects which penetrate the entire thickness of the film.

Attempts to grow multilayer silicon-germanium structures must overcome the fundamental limitations imposed by the growth modes of the constituents. Studies of Si/Ge/Si quantum-well structures have revealed islanding of silicon capping layers as well as severe interdiffusion effects, both evidently resulting from surface energetics.

SUMMARY OF THE INVENTION

We have invented a surfactant-enhanced epitaxy process which permits essentially epitaxial layers of a second elemental semiconductor material such as germanium with a bulk-state crystal-lattice structure to be grown on a substantially crystalline first semiconductor material such as silicon with a different bulk-state crystal-lattice structure and which avoids problems of the prior art noted above.

Broadly, the process of the invention involves depositing a layer of the second crystallizable elemental semiconductor material on an accomodatable-lattice-mismatch target Surface of a substantially-single-crystalline portion of the first semiconductor material to produce a multi-atomic-layer, essentially-epitaxial layer of the second material on the first material.

The process of the invention includes the step of exposing the target surface of the first material to a high vacuum. A gaseous flux comprising a multivalent surfactant element is directed onto the target surface to deposit the surfactant element on the target surface. The surfactant element is deposited with a coverage of at least approximately one monolayer.

The process of the invention includes the step of directing a gaseous flux comprising the second material onto the target surface bearing the multivalent surfactant element. The multivalent surfactant element facilitates a layer-by-layer epitaxial growth of the second material on the target surface of the first material. The gaseous flux comprising the second material is continued for a time sufficient to deposit a layer of the second material having a structurally relaxed crystal lattice structure with a lattice-mismatch-accomodation dislocation network formed essentially at the interface between the second material and the target surface of the first material.

Antimony is a particularity preferred multivalent surfactant element for the surfactant-enhanced epitaxy process of the invention. Arsenic is a preferred multivalent surfactant element for the process. Group III and group V elements including boron, aluminium, gallium, indium, thallium, phosphorous, and bismuth together with gold, silver, tin and lead are expected to be suitable multivalent surfactant elements for certain applications.

In a preferred embodiment of the process of the invention, a gaseous flux comprising the multivalent surfactant element is directed onto the target surface bearing the surfactant element during a time when the gaseous flux comprising the second material is directed onto the surface. In this way a coverage of the surfactant element on the surface is maintained as the layer of second material is deposited.

A preferred layered structure of the invention includes a substrate comprising substantially-single-crystalline silicon having an oriented crystal face with substantially a (111) crystallographic orientation forming the accomodatable-lattice-mismatch target surface. The preferred layered structure of the invention also includes a layer comprising substantially-single-crystalline germanium extending on the oriented crystal face of the silicon substrate. The crystal lattice of the germ anium is essentially epitaxial to the crystal lattice of the silicon substrate. The germanium layer preferably has a thickness of greater than about twenty monolayers. The quality of the crystallinity of the germanium layer is sufficient to provide a minimum yield $\chi_{min}$ of about 5 percent or less for substantially-channeled incidence to essentially-random incidence Rutherford ion backscattering, as measured with an approximately 100 keV beam of $He^+$ ions.

In a preferred embodiment of the invention, an epitaxial layer of germanium is deposited on a face of substantially single-crystalline silicon having a substantially (111) crystallographic orientation in which a dimensional mismatch of approximately four percent between the germanium lattice and the silicon lattice in the (111) crystallographic plane is accomodated by a lattice-mismatch-accomodation dislocation network which is essentially localized at the germanium/silicon interface. Approximately a monolayer of antimony Sb is adsorbed on the surface prior to and during the germanium growth. The antimony monolayer serves as a surfactant and tends to suppress islanding of the germanium. Growth temperatures are preferably in the range from about 550 to about 650° C. The growth rate of germanium is preferably in the range of from about 0.5 to about 1 monolayer per minute. For the first few monolayers, the crystal lattice structure of the germanium layer is pseudomorphic to the lattice structure of the substantially (111) oriented target surface of the silicon substrate. At a thickness of about eight monolayers, misfit dislocations appear between the germanium lattice and the silicon lattice at the germanium/silicon interface. In a preferred germanium film with a thickness of about 50 monolayers, it was found that the lattice structure of the film was essentially relaxed to the bulk-state germanium crystal lattice structure. A lattice-mismatch-accomodation dislocation network which accomodated the mismatch between the germanium and silicon crystal lattices was essentially localized at the germanium/silicon interface.

In preferred embodiments of the invention, the defect density in the germanium epitaxial layer can be comparable to or even lower than the defect density of conventional bulk-state crystalline germanium. Epitaxial germanium films on a silicon substrate made essentially as described in the preceding paragraph were analyzed by the Rutherford ion backscattering technique with a medium energy ion scattering (MEIS) instrument, using helium ion beam with an energy of approximately 200 keV. The backscattering yield in a channeling direction, normalized relative to the backscattering yield in a random incidence direction, is referred to as the "minimum yield" $\chi_{min}$ and provides a measure of the crystal quality. The minimum yield $\chi_{min}$ measured in such germanium on silicon films was generally found to be as good as the minimum yield typically measured on a conventional bulk-state germanium single crystal.

Once the germanium film has relaxed to the bulk germanium lattice constant, growth of germanium can be continued to any desired thickness without the surfactant. Thus, thick, substantially defect-free epitaxial germanium films can be grown on a silicon substrate with preferred embodiments of the present invention.

If desired, a preferred germanium-on-silicon layered structure of the invention can include an overlayer comprising substantially single-crystalline silicon extending on a surface of the germanium layer opposing the silicon substrate. The crystal lattice of the silicon in the overlayer is preferably essentially epitaxial to the crystal lattice of the germanium layer. Moreover, using a multivlent surfactant element such as antimony, a thick, substantially defect-free overlayer of silicon can be grown on the layer of germanium by essentially the same preferred method of the invention as described above for growing a layer of germanium on a substrate of silicon. The silicon overlayer can have a crystal lattice structure which is structurally relaxed to the silicon bulk-state crystal lattice structure. The lattice mismatch between the crystal lattice structure of the silicon overlayer and the crystal lattice structure of the epitaxial germanium layer is accomodated by a lattice-mismatch-accomodation dislocation network which is essentially localized at the interface between the silicon overlayer and the germanium epitaxial layer. The essentially-epitaxial germanium layer may thereby be effectively embedded in substantially-crystalline silicon, with the crystal lattice structures of both the silicon and the germanium being structurally relaxed to their respective bulk-state crystal lattice structures.

A preferred layered structure of the invention may include a plurality of repeating pairs of adjacent layers of substantially single-crystalline silicon and substantially single-crystalline germanium. The crystal lattices of adjacent layers of silicon and germanium are preferably essentially epitaxial to one another to form a silicon/germanium superlattice.

Epitaxial germanium films of preferred embodiments of the invention can be used as a "template" for subsequent epitaxial growth of other crystalline materials which are essentially lattice matched to germanium in its bulk-state crystal lattice structure. For example, fluoride insulators or a compound semiconductor such as gallium arsenide GaAs may be grown on such a preferred epitaxial layer of germanium on a substrate of silicon.

In one preferred layered structure of the invention, a silicon substrate may comprise a first dopant element at a first dopant concentration in a region in the substrate proximate an epitaxial layer of germanium. The layer of germanium may include of second dopant element different from the first dopant element at a second dopant concentration in a region proximate to the silicon substrate.

Epitaxial germanium films on silicon substrates are expected to find use in fabricating germanium-based devices such as infrared detectors, waveguides, and other opto-electronic devices.

Preferred embodiments of the process of the invention can be used, for example, to deposit a layer of germanium on a crystal face of a silicon substrate with a substantially (111) crystalline orientation having a thickness of essentially macroscopic dimensions. For thicknesses of up to about eight monolayers, the layer of germanium may be essentially defect free with a strained crystal lattice structure essentially pseudomorphic to the bulk-state crystal lattice structure of silicon. As the thickness of the germanium layer is increased from roughly eight monolayers to roughly twenty monolayers, defects in the crystal lattice of the germanium appear to compensate for an approximately four-percent mismatch between bulk-state lattice dimensions of germanium and silicon. For thicknesses of the germanium layer greater than about twenty monolayers, the crystal lattice structure of the germanium relaxes to a bulk state structure. The approximately four percent mismatch between the bulk-state lattice dimensions of germanium and silicon is accomodated by a lattice-mismatch-accomodation dislocation network which is essentially localized at the interface between the germanium and the substantially (111) surface of the silicon.

For comparison, a layer of germanium having a thickness of essentially macroscopic dimensions may be deposited on a crystal face of a silicon substrate with an (001) crystalline orientation using a multivalent surfactant element. For thicknesses of up to about ten or twelve monolayers, the layer of germanium may be essentially defect free in that case. As the thickness of the germanium layer is increased from about ten or twelve monolayers to about fifteen monolayers, defects in the crystal lattice generally begin to appear to compensate for the approximately four-percent mismatch between lattice dimensions of germanium and silicon. For thicknesses of the germanium layer greater than about fifteen monolayers, strain-relief defects combining two Σ9 boundaries and a twin tend to occur in the germanium layer. Such defects are generally small in size, essentially uniformly distributed throughout the germanium layer, and effectively independent of one another. A detailed analysis of the strain-relief defects in such germanium layers on (001) silicon is set forth in an article published by Copel et al. in *Physical Review Letters*, volume 63, pages 1826 through 1829 (Oct. 23, 1989), which article is hereby incorporated in the present specification by reference.

Also for comparison, a layer of substantially defect-free germanium having a strained crystal lattice structure substantially pseudomorphic to the bulk-state crystal lattice structure of silicon may be epitaxially embedded in silicon by the following procedure: A clean surface of silicon having a (001) crystallographic orientation may be prepared to serve as a substrate surface. The substrate surface may exhibit a (1×2) surface unit cell characteristic of silicon (001). The silicon substrate is preferably heated to a temperature between about 400° C. and about 700° C. The substrate surface is then preferably exposed to a flux of arsenic vapor which may be evaporated from a heated crucible. Sufficient arsenic is preferably deposited on the sample to result in a saturation coverage of roughly one monolayer. The arsenic evidently bonds to an outermost layer of silicon atoms. Arsenic and germanium are then preferably simultaneously co-deposited on the substrate surface bearing the arsenic. The temperature of the sample is preferably held in a range between about 450° C. and about 550° C. After a desired thickness of germanium having a strained crystal lattice structure essentially pseudomorphic to bulk-state silicon is deposited, a silicon capping layer may be deposited on the sample. In certain cases, no arsenic flux need be applied when the silicon capping layer is deposited because of the close lattice matching between the silicon and the essentially pseudomorphic germanium crystal lattice structures. During the deposition of the capping layer, the sample is preferably maintained at substantially the same temperature as maintained during the co-deposition of germanium and arsenic.

In the process of the preceding paragraph employing a surface layer of arsenic, the arsenic appears to function as a surface-active agent or surfactant. The presence of the surfactant generally enables the epitaxial growth of germanium on a (001) crystal face of silicon to extend to thicknesses exceeding the three-to-six monolayers of conventional processes. The arsenic tends to remain on an outer surface of the germanium layer as the germanium layer grows. The presence of an arsenic surface layer tends to improve significantly the quality of a capping layer of silicon applied over the germanium layer by tending to reduce islanding and interdiffusion.

The chemical mechanism of the process of the present invention is not fully understood at this time. The mechanism set forth below is presently believed to account for the enhanced epitaxial growth observed in preferred embodiments of the invention and is offered for the benefit of the reader. However, the present invention may be practiced and its advantages enjoyed whether or not the mechanism described below is correct in all of its particulars. The mechanism offered below should not be construed as a limitation to the scope of the invention.

Investigations of arsenic and antimony adsorption on silicon and germanium surfaces have shown that antimony adsorbs on the surface essentially without any intermixing with the substrate. Surprisingly, however, it appears that when a growth species of silicon or germanium is deposited on a substrate which bears an approximately monolayer coverage of antimony in accordance with preferred embodiments of the invention, atoms of antimony and the deposited growth species of silicon or germanium rapidly exchange sites. The growth species is thus incorporated into sites on the surface of the substrate. Moreover, once the growth species is incorporated onto a site on the surface effectively below the antimony, surface diffusion of the growth species appears to be significantly reduced. The antimony layer thus appears to inhibit the formation of islands of the growth species, but allows a film of the growth species to grow epitaxially. Although antimony atoms and atoms of the growth species rapidly exchange sites upon deposition of the growth species, in preferred embodiments of the process of the invention, antimony is not incorporated into the resulting epitaxial film at concentrations greater than concentrations normally associated with conventional semiconductor dopant concentrations.

Numerous types of layered structures may be fabricated using a multivalent surfactant element to influence the growth mode of the constituents in accordance with the invention—by tending to alter the growth mode from principally island formation to essentially layer-by-layer epitaxial growth, for example. Among such types of layered structures of the invention are epitaxial germanium embedded in crystalline silicon, $Ge_xSi_{1-x}$ alloy layers embedded in a substantially-crystalline silicon or germanium matrix, pure silicon layers embedded in a germanium host, and capping of a much thicker heterolayer. The structures of the invention can be repeated in multiple iterations to form a superlattice, if desired.

The structure of the invention may also be fabricated with a compound semiconductor as one of the constituents, if desired. For example, germanium having a structurally relaxed bulk-state crystal lattice structure could be embedded in a gallium-arsenide matrix.

If desired, substantially defect-free germanium may be grown on (111) facets etched on a substantially (001) face of a silicon substrate. Such substantially (111) facets may be etched in the substantially (001) face of a silicon substrate by conventional lithographic techniques. If the substantially (001) face of the silicon substrate is effectively covered with such substantially (111) facets it is expected to be possible to deposit a thick, substantially defect-free layer of germanium having a structurally-relaxed bulk-state germanium crystal lattice structure on the substantially (001) face of the silicon substrate with the lattice mismatch between the germanium and silicon bulk-state crystal lattice structures accomodated by a lattice-mismatch-accomodation dislocation network essentially localized to the faceted interface between the germanium and the silicon.

Preferably, the multivalent surfactant may be introduced by molecular-beam epitaxy. Alternatively, the surfactant can be introduced by a chemical source such as $AsH_3$. A chemical source such as $SiH_4$, $Si_2H_6$, $Cl_2$, $GeH_4$, $Ge_2H_6$, or $GeH_2Dl_2$ can be used to introduce the growth species, if desired.

Preferred layered structures of the invention can be used to advantage in solid-state electronic devices.

The surfactant-enhanced epitaxy process of the invention may be used to fabricate transistors with bases of the alloy $Ge_xSi_{1-x}$. After growth of such an alloy base, a silicon emitter may be grown by chemical vapor deposition or molecular beam epitaxy. The use of a surfactant element in accordance with the invention during initial emitter growth would be advantageous in tending to insure an abrupt interface in a critical region of the p-n junction.

The process of the invention may be used to fabricate multilayered silicon/germanium superlattices. Such silicon/germanium superlattices may find application as x-ray mirrors.

BRIEF DESCRIPTION OF THE DRAWINGS

Preferred embodiments of the invention are described below with reference to the following drawings. The Rutherford ion backscattering data of the drawings were obtained with a medium-energy ion scattering system employing a beam of $He^+$ ions. An electrostatic energy analyzer was used to resolve the backscattered ions. For channeling-incidence data, the ion beam was directed substantially along a (111) crystallographic axis of the sample. Random-incidence data were obtained by an azimuthal rotation of about eleven degrees about the sample normal.

PREFERRED MODE FOR CARRYING OUT THE INVENTION

Figure 2:
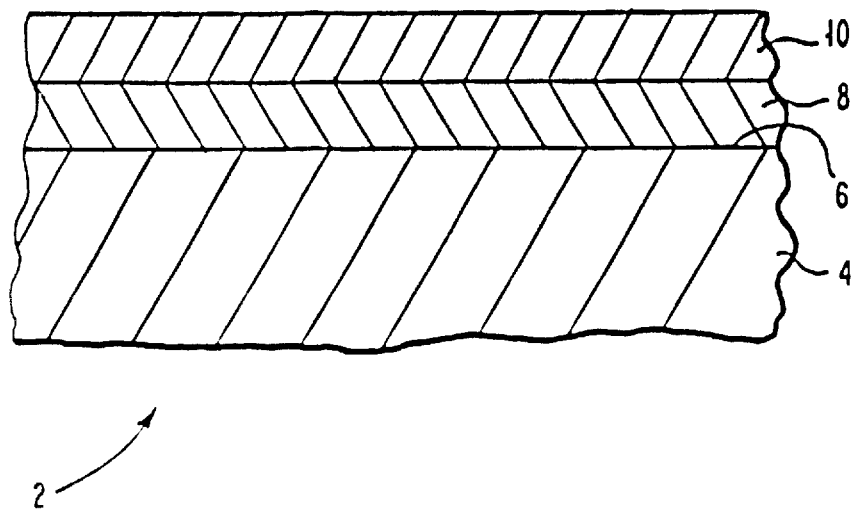
FIG. 2 is a schematic partial cross-sectional diagram of a preferred embedded epitaxial germanium layer in a silicon matrix.

Turning now to FIG. 2, an embedded epitaxial layer structure 2 of the invention includes a substrate 4 of crystalline silicon having an oriented crystal face with a (111) crystallographic orientation. An embedded layer 8 of epitaxial germanium extends over the oriented crystal face 6 of the silicon substrate 4. A capping layer 10 of epitaxial silicon in turn extends over the embedded layer 8 of germanium.

A preferred embedded epitaxial layer structure 2 of the invention may be made by the following preferred process of the invention.

A substrate of crystalline silicon having a crystal face with an (111) crystalline orientation is introduced into a stainless-steel, ultra-high-vacuum vacuum system. Prior to insertion into the vacuum system the sample is not subjected to any chemical etching or pre-cleaning steps. The vacuum system is evacuated to a base pressure of about $5 \times 10^{-11}$ Torr. The silicon substrate is degassed by heating to about 600° C. for several hours, followed by an anneal at about 900° C. for approximately 30 minutes. Subsequently the crystal face of the silicon substrate is sputtered with an argon ion beam with an energy of about 1 keV and an angle of incidence of about 60 degrees with the surface normal, at a dose of about $5 \times 10^{14}$ ions per cm$^2$. Finally, the sample is heated to approximately 1050° C. for about one minute to remove native oxide. After flash-off of the native oxide, the crystal face exhibits a (7×7) low energy electron diffraction (LEED) pattern, characteristic of an atomically clean Si(111) surface.

Prior to the commencement of growth of the germanium layer, the substrate is heated to a growth temperature of about 600° C. The (111) crystal face of the heated silicon substrate is exposed to a flux of Sb$_4$ molecules, evaporated from a quartz crucible containing solid elemental antimony maintained at a temperature of in the range of from roughly 400 to roughly 500° C. After several minutes the crystal face will be covered with close to a monolayer of antimony. Further exposure to Sb$_4$ vapor will not increase the coverage, which saturates at approximately one monolayer.

The crystal face of the silicon substrate covered with approximately one monolayer of antimony is now exposed to a flux of germanium vapor. Germanium is evaporated from a boron nitride crucible containing elemental, liquid germanium maintained at a temperature of about 1000° C. The growth rate may be about 0.3 monolayers per minute. During growth of the germanium film, the substrate is simultaneously exposed to a flux of Sb$_4$, as in the preceeding step. Without a continuous antimony flux, the surface antimony coverage slowly drops due to re-evaporation of antimony from the substrate surface. After reaching the desired thickness of deposited germanium, the germanium flux is removed.

In the final step, the substrate bearing the germanium film and a surface monolayer of antimony is exposed simultaneously to a flux of silicon vapor and a flux of antimony. Silicon is evaporated with an electron-beam evaporator. Specifically, an approximately 3 keV focused electron beam is directed onto a central portion of a silicon disk, which melts the silicon. The silicon vapor which emanates from the molten material provides the silicon flux that impinges on the coated substrate. Silicon may be grown at a rate in the range of about 0.2 to about 0.4 monolayers per minute. The flux of silicon is continued until the thickness of the silicon capping layer reaches a desired value.

During the growth steps, the pressure in the sample chamber is in the range of from about $1 \times 10^{-10}$ to about $2 \times 10^{-10}$ Torr. The antimony, germanium and silicon evaporators are located in a separate vacuum chamber, coupled to the sample chamber. The silicon and germanium evaporators are surrounded by water-cooled copper shrouds. The antimony evaporated is surrounded by a liquid-nitrogen-cooled copper shroud. The evaporators are well shielded from each other, preventing cross-contamination. Sample and evaporator chambers are pumped by liquid helium cooled cryopumps.

Figure 5:
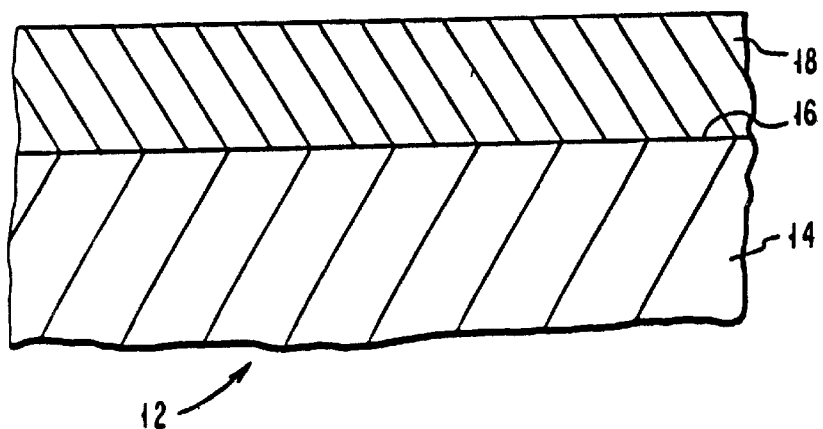
FIG. 5 is a schematic partial cross-sectional diagram of a preferred embodiment of the invention having an epitaxial germanium layer on a silicon substrate.

Turning now to FIG. 5, a preferred epitaxial layer structure 12 of the invention includes a substrate 14 of crystalline silicon having an oriented crystal face 16 with a (111) crystallographic orientation. A layer 18 of epitaxial germanium extends over the oriented crystal face 16 of the silicon substrate 14. An approximately one-monolayer thick layer of antimony on the surface of the germanium is not shown.

Figure 6:
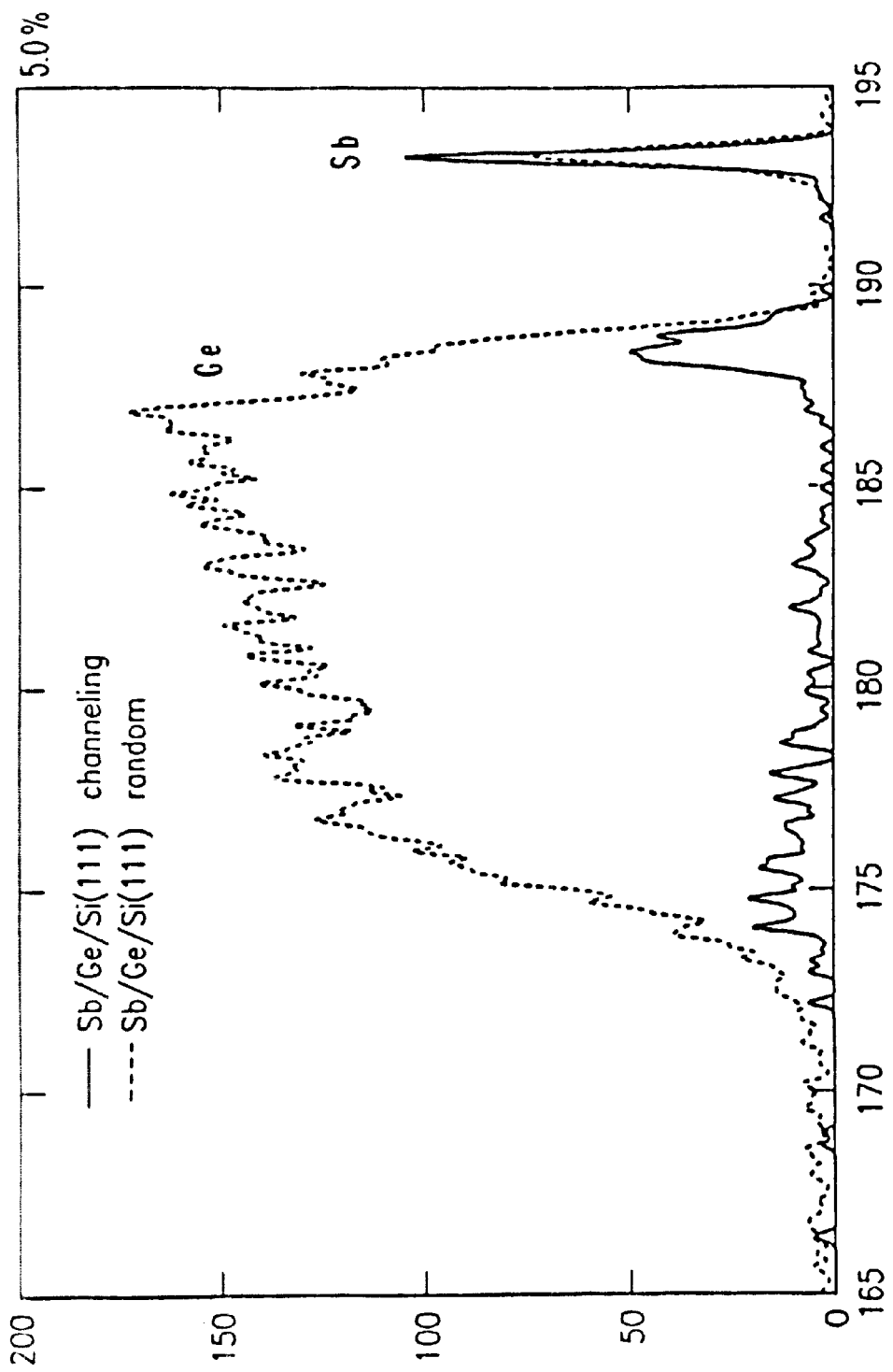
FIG. 6 is a plot of random and channeling incidence Rutherford ion scattering spectra on a germanium film grown on Si(111) with a antimony surfactant layer in accordance with a preferred method of the invention. Only the antimony and germanium signals are shown. The He+ beam energy was about 185 keV.

FIG. 6 shows two Rutherford ion backscattering spectra in a channeling incidence direction and an effectively random direction for the preferred epitaxial germanium-on-(111)-silicon layer structure shown schematically in FIG. 5. The quality of the germanium epitaxy can be evaluated by the Rutherford ion backscattering yield under channelling conditions relative to the yield in an effectively random incidence geometry. This ratio, known as the minimum yield ($\chi_{min}$), is typically about 3 percent for a bulk crystal. Any imperfections in a crystal would result in greater dechannelling, thereby raising $\chi_{min}$.

The energy of the helium ion beam for both spectra was approximately 185 keV. The germanium layer was approximately 110 monolayers thick. As may be seen in FIG. 6, the minimum yield $\chi_{min}$ for germanium was approximately two percent, which indicates excellent crystal quality for the germanium layer, comparing favorably to bulk crystalline germanium.

Figure 7:
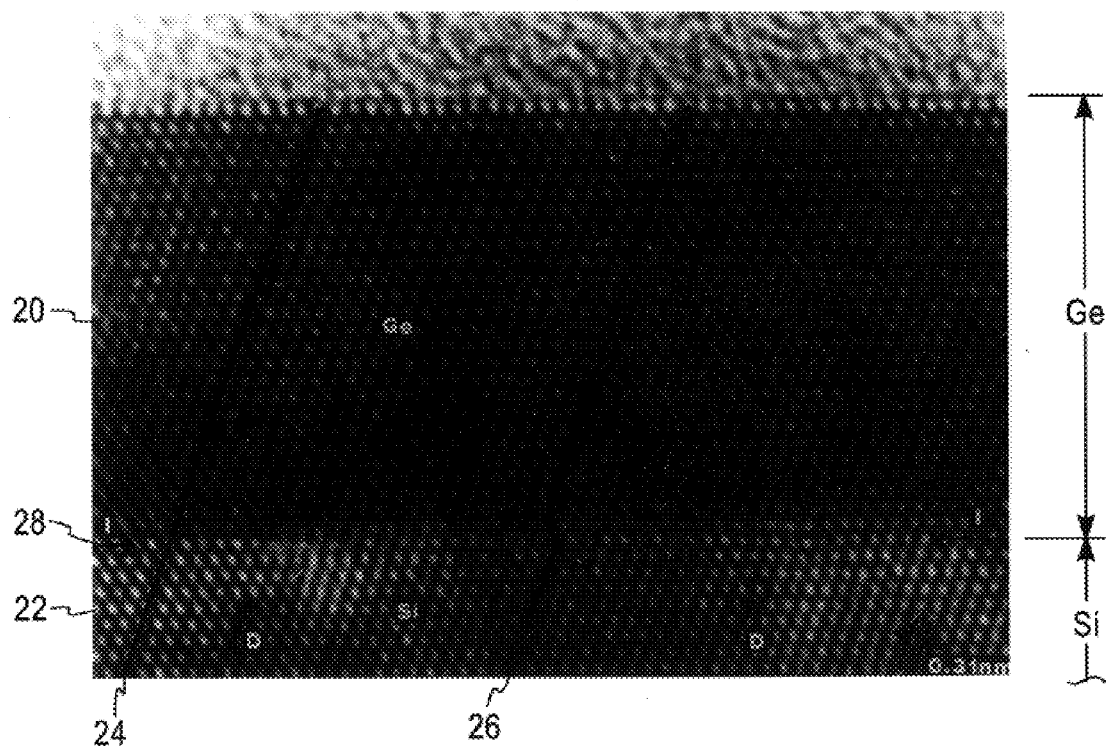
FIG. 7 is a high-resolution cross-sectional transmission electron micrograph of a epitaxial germanium film grown on Si(111) with an antimony surfactant layer.

FIG. 7 shows a high-resolution cross-sectional transmission electron micrograph of a preferred epitaxial-germanium-on-(111)-silicon layer structure as shown schematically in FIG. 5. The germanium layer 20 is approximately 110 monolayers thick. The germanium layer 20 has relaxed to the bulk-state crystal lattice structure of germanium as was indicated in planer-view electronmicrographs and diffraction patterns (not shown). The silicon substrate 22, only an upper portion of which is shown in FIG. 7, is in a bulk-state silicon crystal lattice structure. A lattice mismatch between the crystal lattice structures of the silicon substrate 22 and the germanium layer 20 is indicated on the micrograph of FIG. 7 by lines 24 and 26 drawn on the micrograph along two lattice planes. Inspection of the micrograph of FIG. 7 will reveal that the lattice mismatch between the germanium and silicon crystal lattices has been accomodated by a dislocation network which is essentially localized at the interface 28 between the germanium layer 20 and the silicon substrate 22. Essentially no defects are evident in either the germanium layer 20 or the silicon substrate 22 shown in the micrograph of FIG. 7.

For comparison with the epitaxial germanium films grown on (111) surfaces of silicon substrates in accordance with preferred embodiments of the invention discussed above, FIGS. 3a–3c provide data concerning certain epitaxial germanium films grown on (001) faces of silicon substrates.

Figure 1:
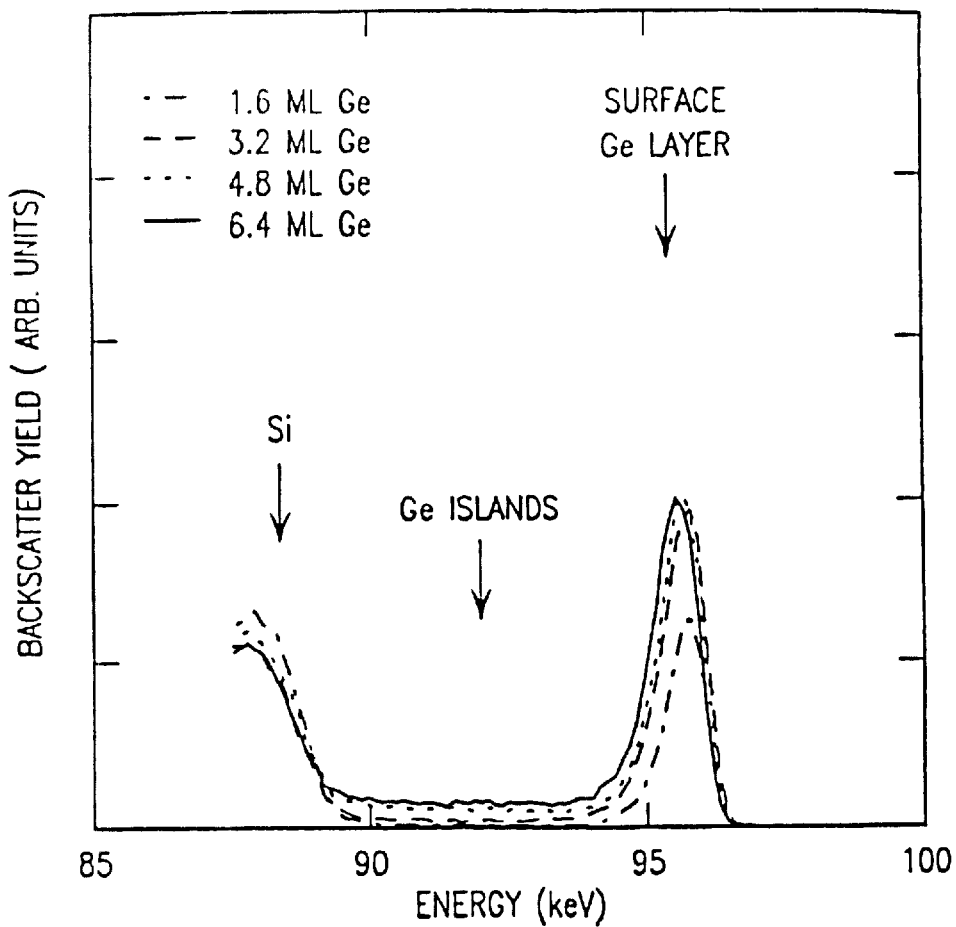
FIG. 1 provides ion backscattering spectra for certain Ge/Si(001) films grown conventionally without a multivalent surfactant element layer. All of the spectra were taken in a random, non-channelling incidence direction. A tail on the germanium backscatter peak is attributed to islanding of the germanium. The islanding begins at a coverage of roughly three monolayers. The continuous surface germanium layer saturates at a coverage of about three monolayers.
Figures 3A, 3B, 3C:
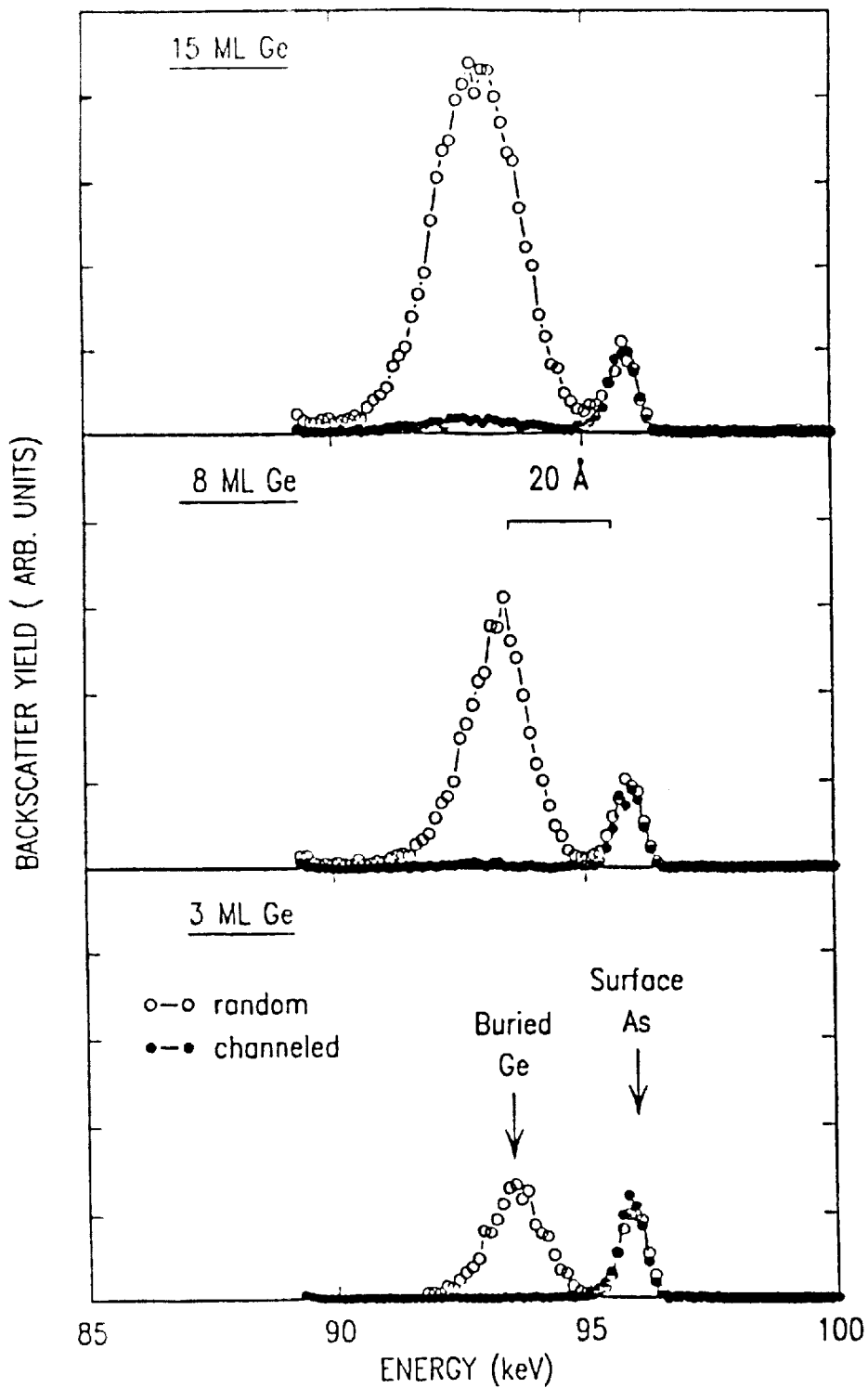
FIGS. 3a–3c provide ion backscattering spectra for comparison Si/Ge/Si(001) epitaxial-germanium-embedded-in-silicon structures grown with an arsenic surfactant. Spectra are shown in each of FIGS. 3a–3c for both channeled and randomly incident beams employing a $He^+$ beam energy of about 100 keV. Islanding of the germanium is not observed through a coverage of about fifteen monolayers. The germanium films have been capped with approximately sixteen monolayers of epitaxial silicon. The arsenic layer resides on top of the silicon capping layer.

Specifically, the Rutherford ion backscattering spectra of FIGS. 3a–3c provide evidence that germanium films thicker than six monolayers have been successfully embedded in silicon on an (001) face of the silicon by using an arsenic surfactant. Spectra are shown for both channelled and effectively randomly incident beams of helium ions at an energy of about 100 keV. In FIG. 3a approximately three monolayers of germanium have been deposited at about 520° C. on an arsenic-saturated surface of silicon with a (001) crystallographic orientation. During the germanium deposition, an arsenic flux was maintained on the sample. Afterwards, the germanium film was capped with approximately sixteen monolayers of silicon. FIGS. 3b and 3c respectively show approximately eight and approximately fifteen monolayers of germanium films grown under identical conditions. Unlike the films of the prior art shown in FIG. 1 and discussed in the Background Art section above, the thickness of the germanium layer has not saturated at approximately three monolayers, but a continuous film has been grown as thick as about fifteen monolayers. The low germanium backscatter yield in the channelling spectra of FIG. 3 is evidence of a high degree of epitaxy. Also, the germanium layer is essentially confined to the subsurface region. In samples fabricated using conventional molecular beam epitaxy, in contrast, germanium will typically diffuse as much as 60 Å through a silicon cap.

Figure 4:
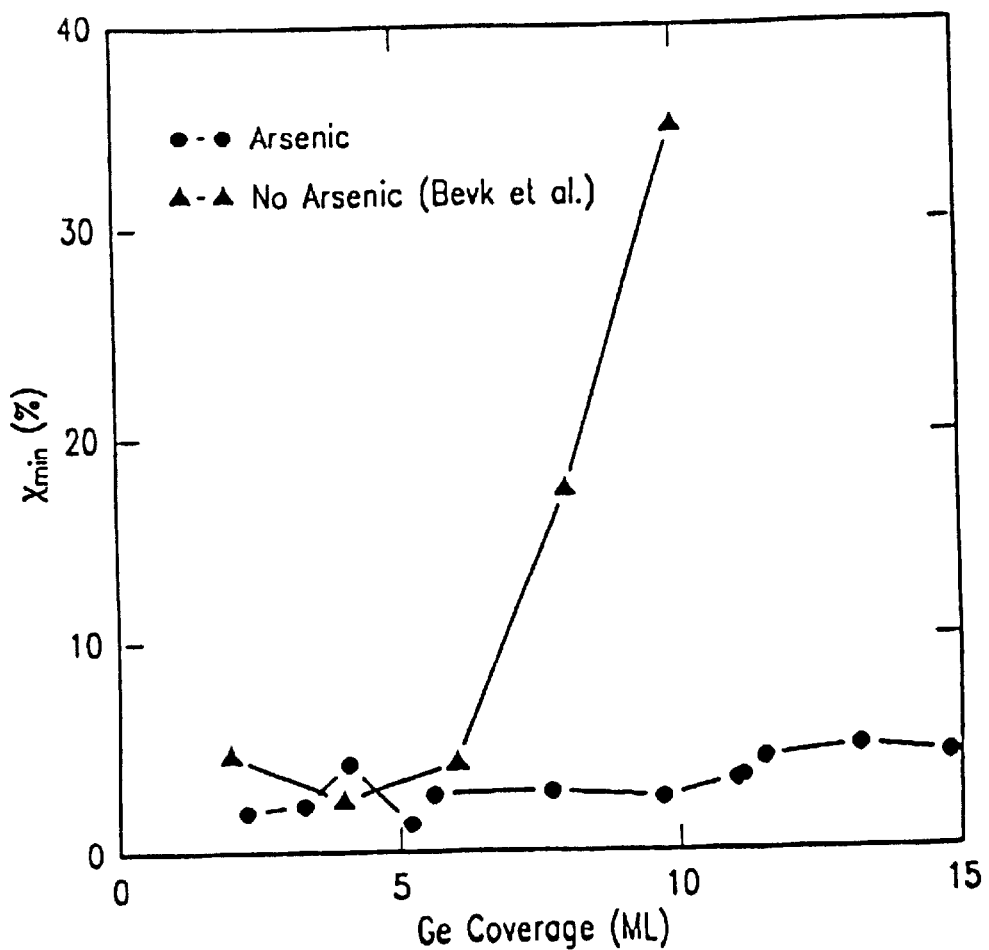
FIG. 4 is a plot of the minimum yield ($\chi_{min}$) for germanium backscattering from comparison Si/Ge/Si(001) epitaxial-germanium-embedded-in-silicon structures grown with and without an arsenic surfactant. The beam energy was about 100 keV. The minimum yield $\chi_{min}$ of bulk silicon in the absence of germanium is about 3 percent at the corresponding depth. Films grown without arsenic show an abrupt increase in $\chi_{min}$ at thicknesses exceeding about six monolayers. Films grown using an arsenic surfactant according to the invention show only a very gradual increase in $\chi_{min}$. Data for growth without arsenic was taken from J. Bevk et al. *Applied Physics Letters*, volume 49, page 286 (1986).

The minimum yield $\chi_{min}$ epitaxial germanium films has been plotted as a function of coverage in FIG. 4. For films grown on a (001) surface of silicon with an arsenic surfactant, there is only a small increase in $\chi_{min}$ with germanium coverage to no greater than about five percent. But films grown without a surfactant show a significantly different behavior. Data taken from an article published J. Bevk et al. *Applied Physics Letter* volume 49, page 286 (1986) demonstrate a substantial increase in dechannelling at thicknesses greater than about six monolayers. The increase in dechannelling is due to a breakdown in the epitaxy of the film.

Additional analysis of layered structures of germanium on (001) surfaces of silicon is set forth in an article by M. Copel et al. published in *Physical Review Letters* volume 63, pages 632 through 635 (Aug. 7, 1989), which article is hereby incorporated in the present specification by reference. As noted above, a thick, epitaxial film of germanium grown on an (001) face of silicon using arsenic as a surfactant can in certain cases have crystal lattice defects extending through the film, in contrast to preferred epitaxial germanium films of the invention described above grown on substantially (111) faces of silicon.

It is not intended to limit the present invention to the specific embodiments described above. It is recognized that changes may be made in the processes and structures specifically described herein without departing from the scope and teaching of the present invention, and it is intended to encompass all other embodiments, alternatives, and modifications consistent with the invention.

We claim:

1. A process for depositing a layer of a second crystallizable elemental semiconductor material on a target surface of a substantially-single-crystalline-portion of a first semiconductor material to produce a multi-atomic-layer, essentially-epitaxial layer of the second material on the first material, the first material and the second material respectively having structurally relaxed bulk-state crystal lattice structures which are mismatched from one another in at least one dimension, the method comprising the steps of:

(a) exposing the target surface of the first material to a vacuum;

(b) directing a gaseous flux comprising a multivalent surfactant element onto the target surface to deposit the surfactant element on the target surface with a coverage of at least approximately one monolayer;

(c) directing a gaseous flux comprising the second material onto the target surface bearing the multivalent surfactant element, the multivalent surfactant element facilitating a layer-by-layer epitaxial growth of the second material on the target surface of the first material, the gaseous flux comprising the second material being maintained for a time sufficient to grow an epitaxial layer of second material having a thickness effective to enable the crystal lattice structure of the second material to assume the structurally relaxed bulk-state crystal lattice structure of the second material, the lattice structure mismatch between the bulk-state crystal-lattice structures of the first and the second materials being accomodated in a lattice-mismatch accomodation layer essentially localized at the interface between the first and the second materials.

2. The process according to claim 1 in which the multivalent surfactant element is selected from the group consisting of boron, aluminium, gallium, indium, thallium, phosphorous, arsenic, antimony, bismuth, gold, silver, tin and lead.

3. The process according to claim 2 in which the multivalent surfactant element is antimony.

4. The process according to claim 1 in which the second crystallizable elemental semiconductor material is germanium or silicon.

5. The process according to claim 1 in which the first material is a group IV semiconductor material, a group III–V semiconductor material, or a group II–VI semiconductor material.

6. The process according to claim 5 in which the first material is selected from the group consisting of silicon, germanium, and gallium arsenide.

7. The process according to claim 1 in which the first material is a silicon-germanium alloy.

8. The process according to claim 1 in which the first material is silicon and the target surface of the silicon first material is a crystal face having an (111) crystallographic orientation and the target surface is maintained at a temperature in the range of from about 550° C. to about 650° C. when the gaseous flux comprising the second material is directed onto the target surface bearing the surfactant element.

9. The process according to claim 8 in which the second material is germanium and the gaseous flux comprising the germanium second material includes elemental germanium vapor, $GeH_4$, $Ge_2H_6$ or $GeH_2Cl_2$.

10. The process according to claim 1 in which the first material is germanium, the second material is silicon, and the gaseous flux comprising the silicon second material includes elemental silicon vapor, $SiH_4$, $Si_2H_6$, or $SiHCl_6$.

11. The process according to claim 1 further comprising the step of:

(d) directing a gaseous flux comprising the multivalent surfactant element onto the target surface bearing the surfactant element during a time when the gaseous flux comprising the second material is directed on the surface to maintain a coverage of the surfactant element on the surface as the layer of second material is deposited.

12. The process according to claim 1 in which the first material is silicon and the target surface of the silicon first material is a crystal face having a (001) crystallographic orientation having (111) facets formed thereon.

* * * * *